United States Patent
Davis et al.

(10) Patent No.: US 10,342,150 B1
(45) Date of Patent: Jul. 2, 2019

(54) MAGNETICALLY LATCHED LRU INSTALLATION AND EXTRACTION MECHANISM

(71) Applicant: Rockwell Collins, Inc., Cedar Rapids, IA (US)

(72) Inventors: Joshua V. Davis, Cedar Rapids, IA (US); Steven W. Kramer, Toddville, IA (US)

(73) Assignee: Rockwell Collins, Inc., Cedar Rapids, IA (US)

(*) Notice: Subject to any disclaimer, the term of this patent is extended or adjusted under 35 U.S.C. 154(b) by 13 days.

(21) Appl. No.: 15/449,438

(22) Filed: Mar. 3, 2017

Related U.S. Application Data

(60) Provisional application No. 62/379,606, filed on Aug. 25, 2016.

(51) Int. Cl.
| | | |
|---|---|---|
| *H05K 5/02* | (2006.01) | |
| *B64D 47/00* | (2006.01) | |
| *B60R 11/02* | (2006.01) | |
| *H01F 7/02* | (2006.01) | |
| *H05K 5/00* | (2006.01) | |

(52) U.S. Cl.
CPC ........ *H05K 5/0256* (2013.01); *B60R 11/0229* (2013.01); *B60R 11/0264* (2013.01); *B64D 47/00* (2013.01); *H01F 7/0252* (2013.01); *H05K 5/0017* (2013.01); *H05K 5/0204* (2013.01)

(58) Field of Classification Search
None
See application file for complete search history.

(56) References Cited

U.S. PATENT DOCUMENTS

| | | | |
|---|---|---|---|
| 4,071,271 A | 1/1978 | Bourrie et al. | |
| 5,402,319 A * | 3/1995 | Shumaker | H05K 7/1404 211/41.17 |
| 5,786,995 A | 7/1998 | Coleman | |
| 7,188,400 B1 | 3/2007 | Beseth et al. | |
| 7,473,931 B1 | 1/2009 | Beseth et al. | |
| 7,566,224 B2 | 7/2009 | Wu | |
| 8,274,783 B2 | 9/2012 | Polizzotto et al. | |
| 8,550,410 B2 | 10/2013 | Fraser | |
| 8,854,818 B1 * | 10/2014 | Angelucci | H05K 7/1402 165/104.33 |
| 8,864,000 B2 * | 10/2014 | Meyer | B60R 11/0235 224/275 |
| 9,323,082 B2 | 4/2016 | Tannas, Jr. | |

(Continued)

*Primary Examiner* — Xanthia C Cunningham
(74) *Attorney, Agent, or Firm* — Angel N. Gerdzhikov; Donna P. Suchy; Daniel M. Barbieri

(57) ABSTRACT

A magnetically latched installation and extraction mechanism for an avionics display unit or other Line Replaceable Unit (LRU) installable in, and extractable from, a vehicle instrument panel includes a bezel attachable to the LRU, the paddle or the bezel including magnets embedded into opposing corners configured to attract the magnetic surfaces of, or the embedded magnets in, the opposing bezel or paddle. The LRU may include hinged paddles having an open position for installing/extracting the LRU from the instrument panel and a stowed position substantially flush with the surface of the bezel, the paddles corresponding to the embedded bezel magnets. Magnets embedded in the hinged paddles may secure the paddles in the stowed position via attraction to the bezel magnets.

18 Claims, 10 Drawing Sheets

(56) References Cited

U.S. PATENT DOCUMENTS

| | | | | |
|---|---|---|---|---|
| 9,334,675 | B2 | 5/2016 | Koehler et al. | |
| 9,695,972 | B1* | 7/2017 | Jiang | F16M 11/041 |
| 2004/0112196 | A1* | 6/2004 | Corcoran | B26D 5/10 |
| | | | | 83/686 |
| 2008/0150662 | A1* | 6/2008 | Broumand | G06F 3/02 |
| | | | | 335/285 |
| 2010/0091454 | A1* | 4/2010 | Degner | G06F 1/1616 |
| | | | | 361/679.58 |
| 2011/0267759 | A1* | 11/2011 | Abram | B60R 11/0235 |
| | | | | 361/679.27 |
| 2012/0043768 | A1* | 2/2012 | Graham | E05B 17/0033 |
| | | | | 292/251.5 |
| 2012/0147533 | A1* | 6/2012 | Wang | F16M 11/10 |
| | | | | 361/679.01 |
| 2013/0234955 | A1* | 9/2013 | Takano | G06F 3/0421 |
| | | | | 345/173 |
| 2014/0049894 | A1* | 2/2014 | Rihn | G06F 1/1616 |
| | | | | 361/679.27 |
| 2014/0245785 | A1* | 9/2014 | Proud | A44C 5/0015 |
| | | | | 63/1.13 |
| 2015/0145174 | A1* | 5/2015 | Comb | B29C 67/0092 |
| | | | | 264/464 |
| 2015/0237748 | A1* | 8/2015 | Andre | H05K 5/0221 |
| | | | | 361/679.55 |
| 2016/0176587 | A1* | 6/2016 | Heraud | B65D 43/02 |
| | | | | 220/230 |
| 2016/0198816 | A1* | 7/2016 | Ogborne | G04B 37/1486 |
| | | | | 24/303 |
| 2016/0334055 | A1* | 11/2016 | Strecker | B61L 1/00 |
| 2017/0130483 | A1* | 5/2017 | Howell | E05B 47/0038 |

* cited by examiner

MAGNETICALLY LATCHED LRU INSTALLATION AND EXTRACTION MECHANISM

CROSS-REFERENCE TO RELATED APPLICATIONS

This application claims priority under 35 U.S.C. § 119(e) to provisional U.S. Patent Application Ser. No. 62/379,606, filed on Aug. 25, 2016. Said provisional U.S. Patent Application 62/379,606 is herein incorporated by reference in its entirety.

BACKGROUND

Traditional installation and extraction (I/E) mechanisms for instrument panel avionics have proven costly, complex, and cumbersome. For example, next-generation display elements incorporating emissive devices or touch-responsive screens create complex packaging, cost, and producibility challenges due to the space constraints of legacy Line Replaceable Unit (LRU) envelopes. In particular, the accommodation of full size I/E handles to legacy envelopes within which touchscreen technologies are implemented can be both difficult and costly. However, eliminating I/E functionality is not a desirable option for airline customers due to human factors and the potential for damage to costly avionics if dropped or mishandled. While full-size, hinged I/E handles may be implemented as a best-value option, these state-of-the art components remain costly. In addition, due to their size and weight they must be secured in place with traditional fasteners, which require the maintenance crew to have a compatible tool on hand. Furthermore, the size of these components makes them more susceptible to damage during deployment. While airline customers require the convenience of I/E functionality, they are also demanding cost-effective, damage-resistant options whose I/E functionality is not tool-dependent.

SUMMARY

In one aspect, embodiments of the inventive concepts disclosed herein are directed to a magnetically latched installation and extraction mechanism for a Line Replaceable Unit (LRU) installable in (and extractable from) a vehicle instrument panel. The mechanism may include a bezel attachable to the LRU and surrounding the display surface of the LRU. The LRU may be installable in and extractable from the instrument panel by the mechanism. The bezel may include passive or permanent magnets positioned within the bezel at or near opposing corners. The mechanism may include hinged paddles for inserting and extracting the LRU. Magnets embedded in the paddles may secure the paddles in a stowed position relative to the LRU via attraction to the bezel magnets.

In a further aspect, embodiments of the inventive concepts disclosed herein are directed to an LRU, such as an avionics display unit, installable in and extractable from an instrument panel of an aircraft or other vehicle. The LRU may include a bezel defining one or more leading edges of the LRU. The LRU may include bezel magnets or passive magnetic surfaces embedded in opposing corners of the bezel. The LRU may include hinged paddles having an open and stowed position, the open position for insertion and extraction of the LRU. The LRU may include paddle magnets or passive magnetic surfaces embedded within the hinged paddles; the paddle magnets may secure the paddles in a stowed position by attracting the corresponding bezel magnets.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION OF EXEMPLARY EMBODIMENTS

Figure 1:
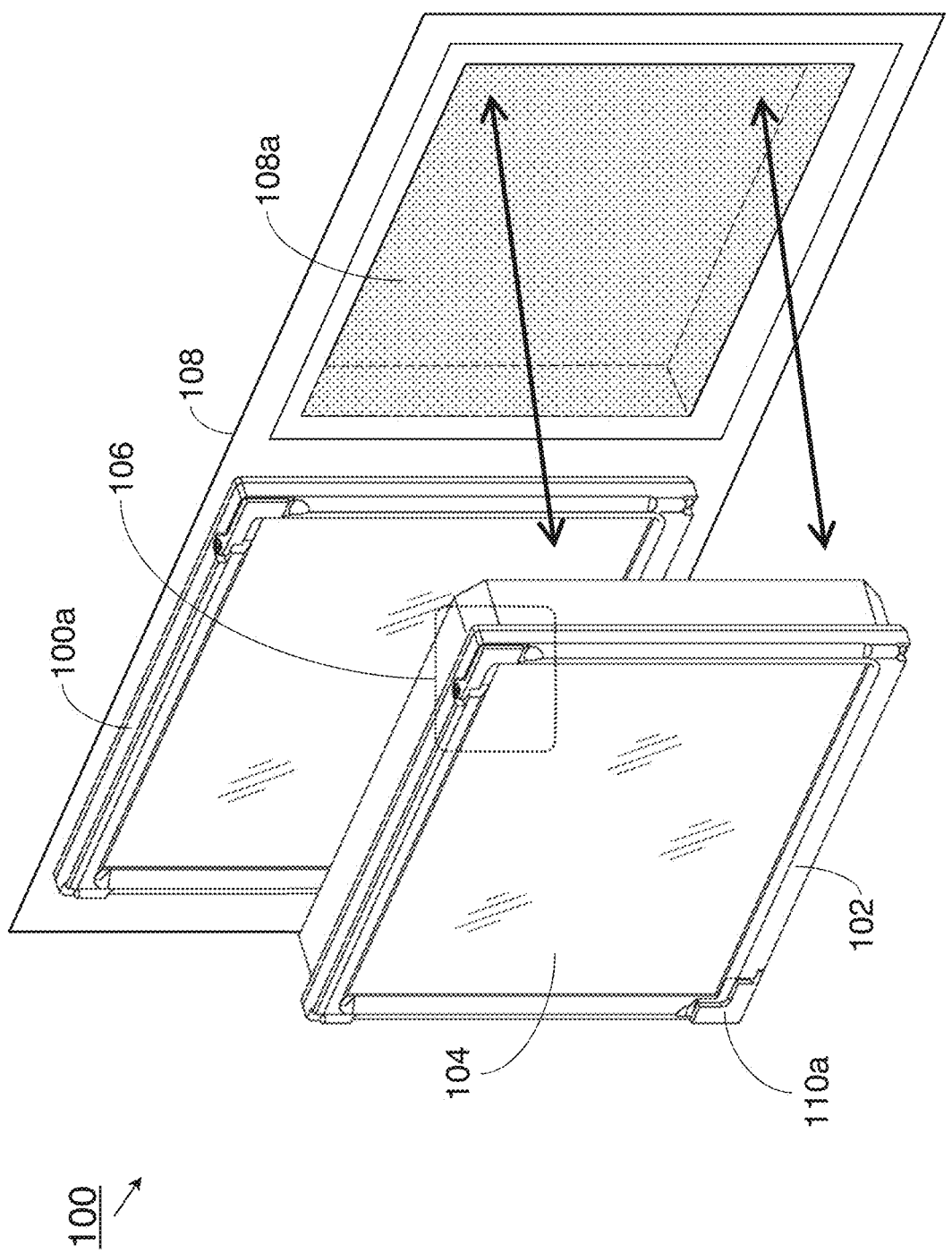
FIG. 1 is a forward perspective view illustration, and FIG. 1A a front view illustration, of an exemplary embodiment of a line replaceable unit (LRU) including an installation/extraction (I/E) mechanism in a stowed position according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a magnetically latched mechanism for installation (and extraction) of a line replaceable unit (LRU) into (and from) a vehicle instrument panel. The mechanism may provide a lightweight alternative to prior art handles, allowing for a larger touchscreen surface while reducing overall the size and weight of the LRU. In addition, the LRU may be efficiently installed and extracted without the need for a dedicated tool.

FIGS. 1/1A (Stowed Position)

Figure 1A:
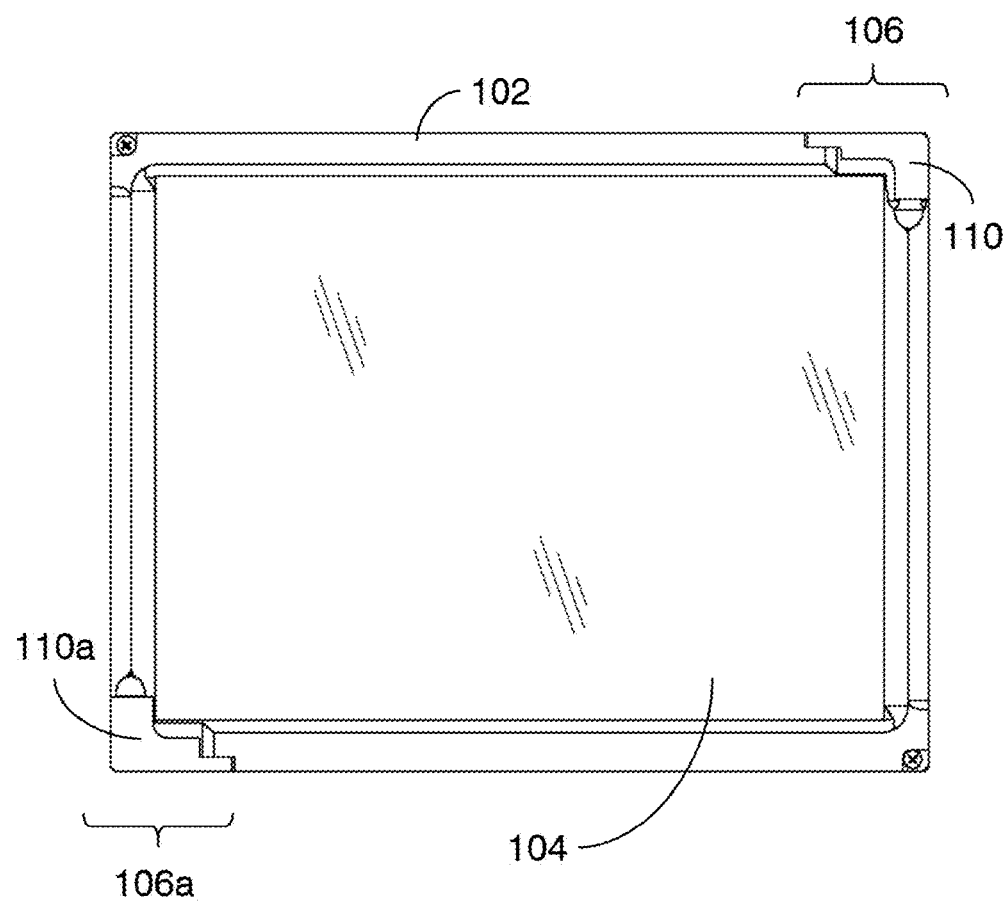

Referring to FIGS. 1 and 1A, an exemplary embodiment of an LRU 100 according to the inventive concepts disclosed herein may include a bezel 102, a touchscreen 104 or similar display surface, and a magnetically latched installation and extraction (I/E) mechanism 106, 106a. The LRU 100 may be installed into the instrument panel 108 of a vehicle. The LRU 100 may include (but is not limited to) a display unit, a radio or communications component, or a "sixpack" or composite bank of primary flight instruments. For example, the LRU 100 may be an avionics display unit installed in an aircraft cockpit or a display unit installed in a ground-based or water-based vehicle (e.g., a seagoing or littoral ship). The external surface of the I/E mechanism 106, 106a may include one or more paddles 110, 110a (e.g., a reduced size/reduced functionality handle) by which the LRU 100 may be installed in, or extracted from, the instrument panel. The bezel 102 or the paddles 110, 110a may be fashioned of any appropriate avionics-grade materials, e.g., high-impact plastic, composite, or aluminum.

Figure 5:
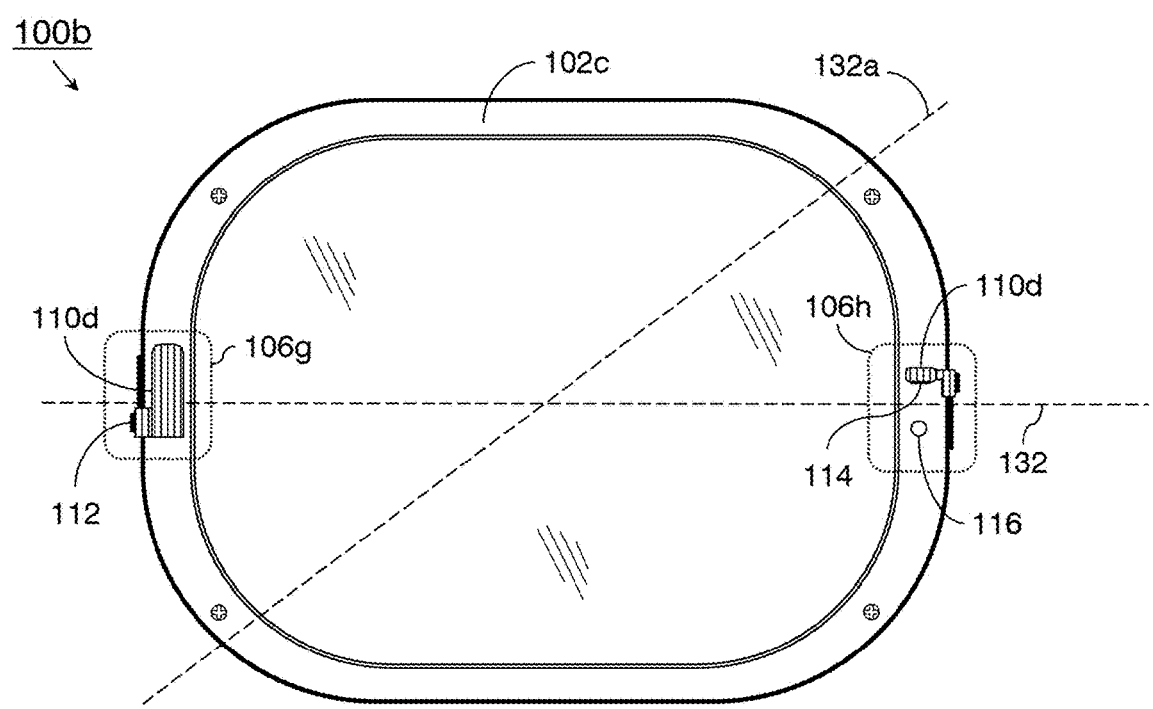
FIG. 5 is a forward view of a non-rectangular embodiment of the LRU of FIG. 1.

The LRU 100 may include I/E mechanisms 106, 106a positioned at opposing corners or edges of a bezel 102 of substantially rectangular shape. For example, the I/E mechanism 106 may be positioned at an upper right corner of the bezel 102, while the IE mechanism 106a may be positioned at a lower left corner thereof. In some embodiments, the I/E mechanisms 106, 106a may be positioned in the upper left and lower right corners respectively of the bezel 102. When the LRU 100 is securely installed in an instrument panel, the I/E mechanisms 106, 106a may be in a stowed position. For example, the stowed paddle 110 of the I/E mechanism 106 may rest proximate to, substantially flush with, or directly behind the exterior surface of the bezel 102. In embodiments where the LRU 100, and thus the bezel 102, is of non-rectangular shape (e.g., a rounded rectangle or elliptical shape having a major axis, e.g., as shown by FIG. 5), the I/E mechanisms 106, 106a may be positioned at opposing ends of the major axis.

Figure 2:
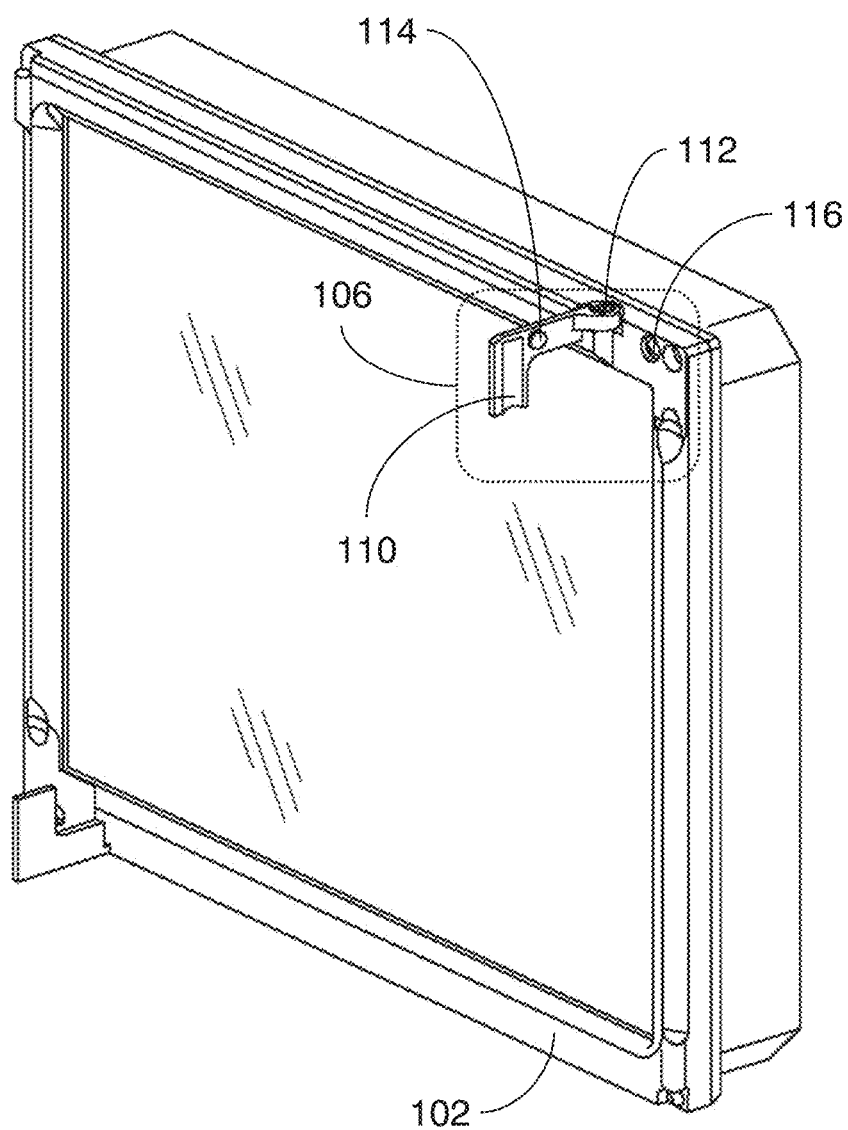
FIG. 2 is a forward perspective view illustration, and FIG. 2A a front view illustration, of the LRU of FIG. 1 including the I/E mechanism in an open position.

FIGS. 2/2A (Open Position)

Figure 2A:
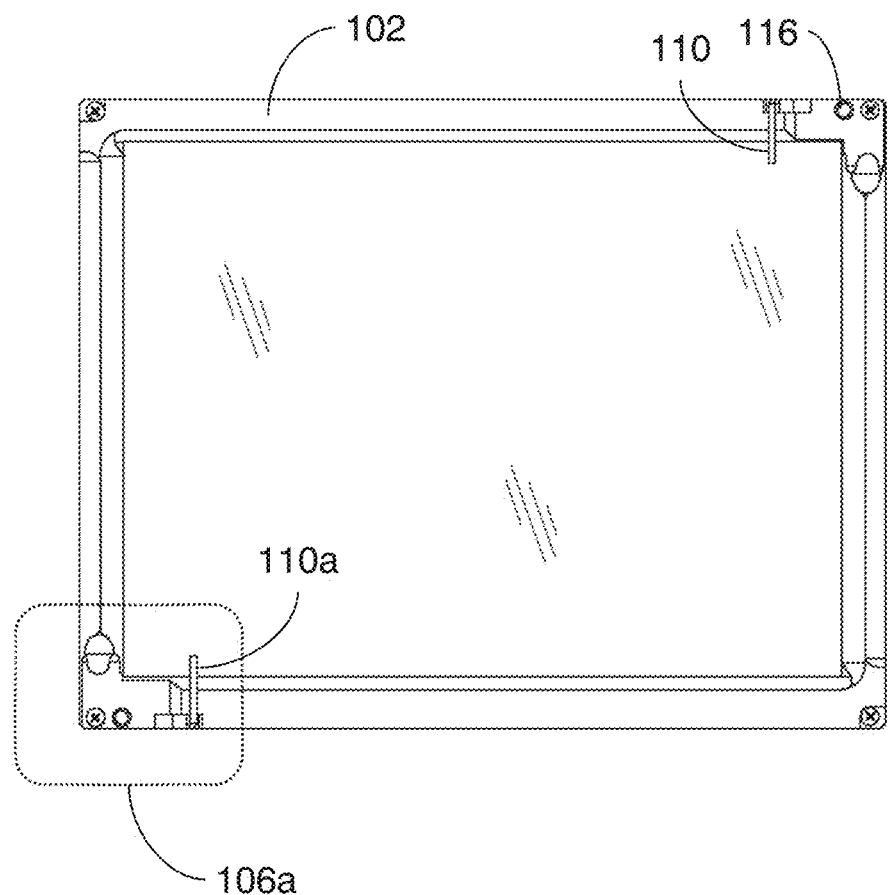

Referring now to FIGS. 2 and 2A, an LRU 100b may be implemented and may function similarly to the LRU 100, 100a of FIGS. 1 and 1A, except that the I/E mechanisms 106, 106a of the LRU 100b may be reversibly converted from the stowed position shown by FIGS. 1/1A to an open position for facilitating installation or extraction of the 100b. When the I/E mechanisms 106, 106a are in the open position, the paddles 110, 110a may be rotated to a position at most substantially perpendicular to the exterior surface of the bezel 102. For example, the paddle 110 may be connected to the bezel 102 by a hinge 112, such that the paddle 110 may be rotated around the hinge 112 between the stowed and open positions. The I/E mechanism 106 may include a paddle magnet 114 embedded within the interior surface of the paddle 110. Similarly, the I/E mechanism 106 may include a bezel magnet 116 embedded within the bezel 102. In some embodiments, the paddles 110, 110a may be compact paddles extending for only a fraction of the total length of an edge of the bezel 102. The paddle magnet 114 and bezel magnet 116 may include any combination of regular permanent or rare earth magnets (e.g., samarium cobalt (SmCo) or neodymium/iron/boron (NdFeB), or other rare earth element combinations) of any appropriate shape (e.g., disk, plate, cylinder, or rectangular solid). The paddle magnet 114 and bezel magnet 116 may be positioned in an attractive orientation, e.g., north/south.

Figure 3:
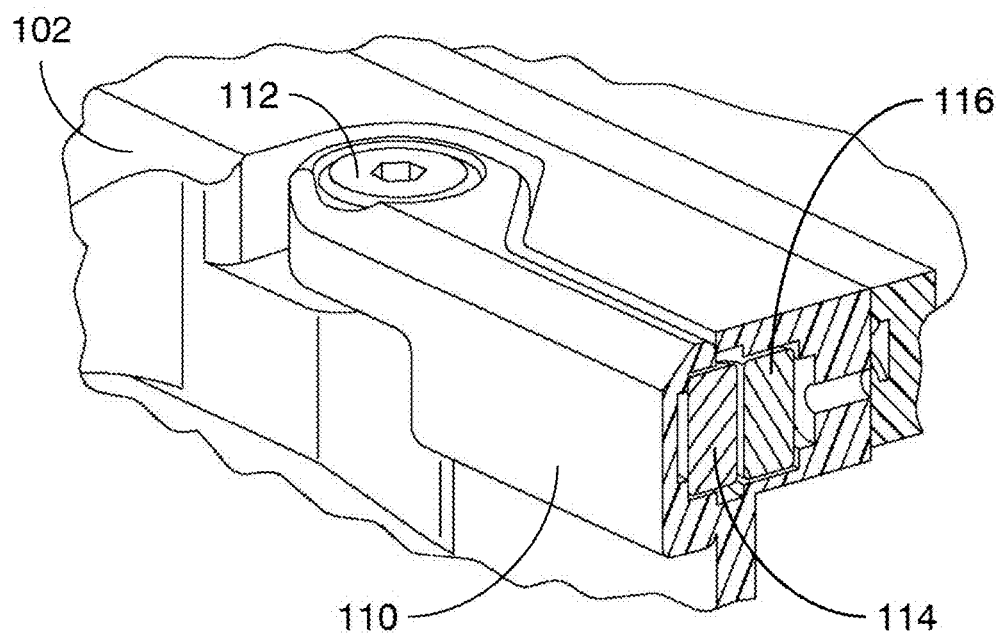
FIG. 3 is a partial cross section of the I/E mechanism of FIG. 1 in the stowed position.

FIGS. 3/3A (Bezel and Paddle Magnets)

Referring now to FIG. 3, the I/E mechanism 106b may be implemented and may operate similarly to the I/E mechanisms 106, 106a of FIGS. 1/1A, except that the paddle 110 of the I/E mechanism 106b may be secured in the stowed position by the attraction of the paddle magnet 114 to the bezel magnet 116.

Figure 3A:
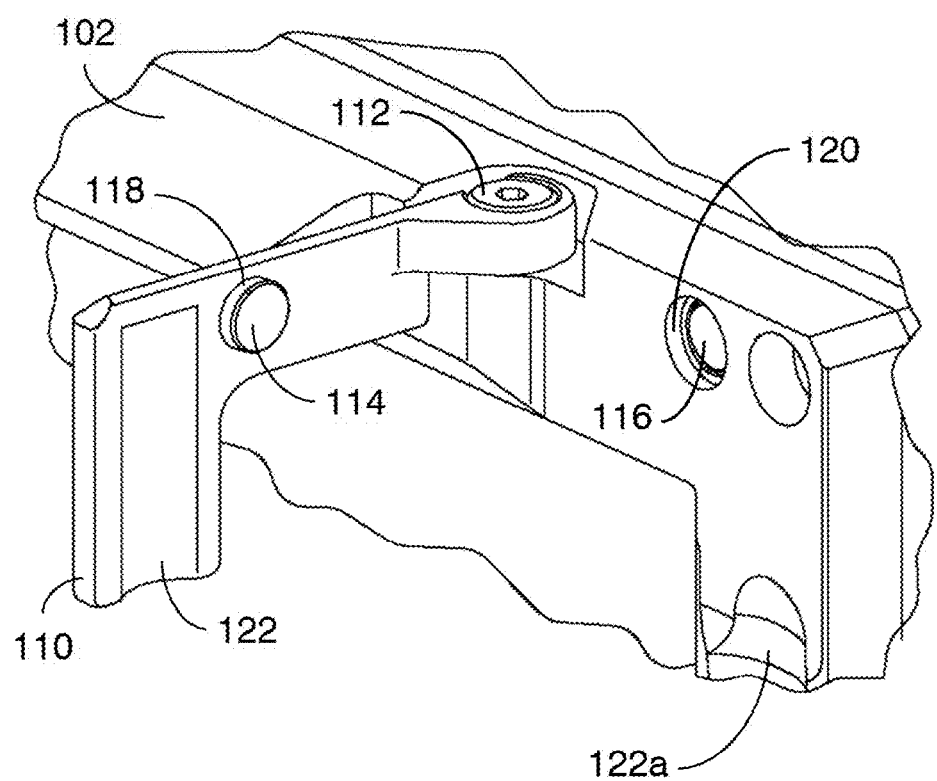
FIGS. 3A, 3B, and 3C are forward perspective view illustrations of the I/E mechanism of FIG. 2 in the open position.

Referring now to FIG. 3A, the I/E mechanism 106c may be implemented and may operate similarly to the I/E mechanisms 106, 106a of FIGS. 2/2A, except that the paddle 110 of the I/E mechanism 106c may rotate relative to the hinge 112 to the open position from the stowed position of the I/E mechanism 106b (FIG. 3). The paddle magnet 114 or bezel magnet 116 may be protectively surrounded by a full or partial steel jacket (118) which may be plated or coated to prevent corrosion. The paddle magnet 114 or bezel magnet 116 may have integrated features allowing for nonadhesive attachment. For example, a countersink on the leading face of the bezel 102 and a through hole in the center of the bezel magnet 116 would allow the bezel magnet to be set (e.g., screwed into) a threaded counterbore (120) with a flathead screw set into the bezel 102 (or the paddle 110). The steel jacket 118 may include an integrated threaded male feature (not shown) allowing for similar attachment without the use of a separate fastener. The paddle 110 may include a recess 122 set into its interior surface. The recess 122 may be of generally concave shape to accommodate a fingertip, and contoured for deployment of the paddle 110 from the stowed position to the open position. For example, the recess 122 may be contoured so that a fingertip (or a tool of similar size and shape) may be inserted between the recess 122 and an opposing recess (122a) set into the bezel 102 (e.g., at or near the point where the paddle 110 terminates). The paddle 110 may be rotated from the stowed position to the open position with a single finger or tool, by dislodging the paddle 110 (and paddle magnet 114) from the bezel 102 (and bezel magnet 116).

Figure 3B:
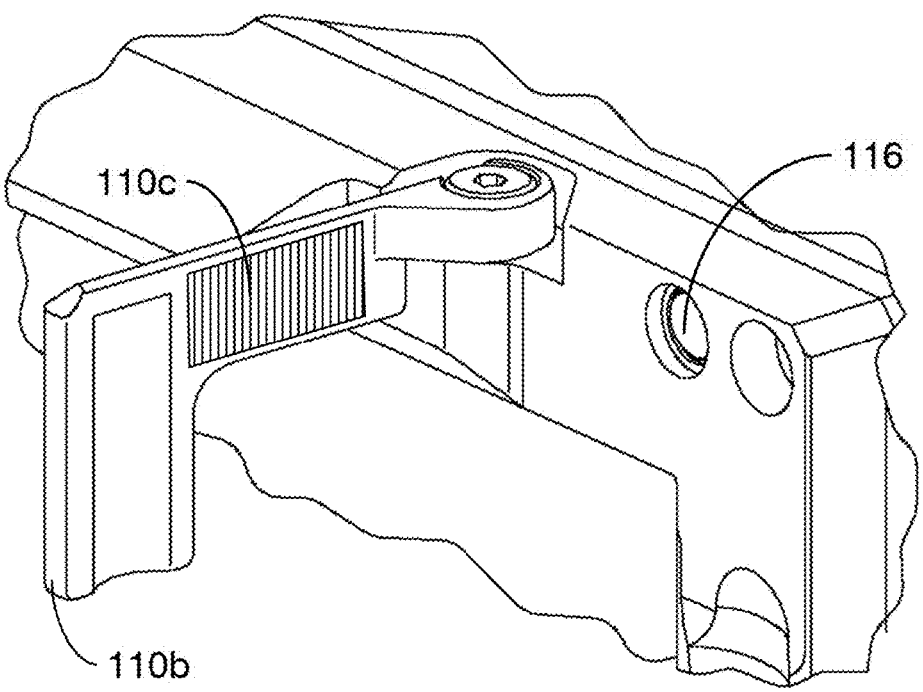

FIGS. 3B/C (Passive Magnetic Material)

Referring to FIG. 3B, the I/E mechanism 106d may be implemented and may function similarly to the I/E mechanisms 106, 106a of FIGS. 2/2A, except that the I/E mechanism 106d may include a paddle 110b fully or partially fashioned of a simple or passive magnetic material (110c). The paddle 110b may be implemented and may function similarly to the paddle 110 of FIG. 2, except that the paddle 110b may not include an embedded permanent magnet (e.g., paddle magnet 114, FIGS. 2/2A). The paddle 110b may be fashioned of low carbon steel or any similarly simple magnetic material (110c) sufficiently magnetic to attract the bezel magnet 116 and maintain the paddle 110b in the stowed position (see FIG. 1).

Figure 3C:
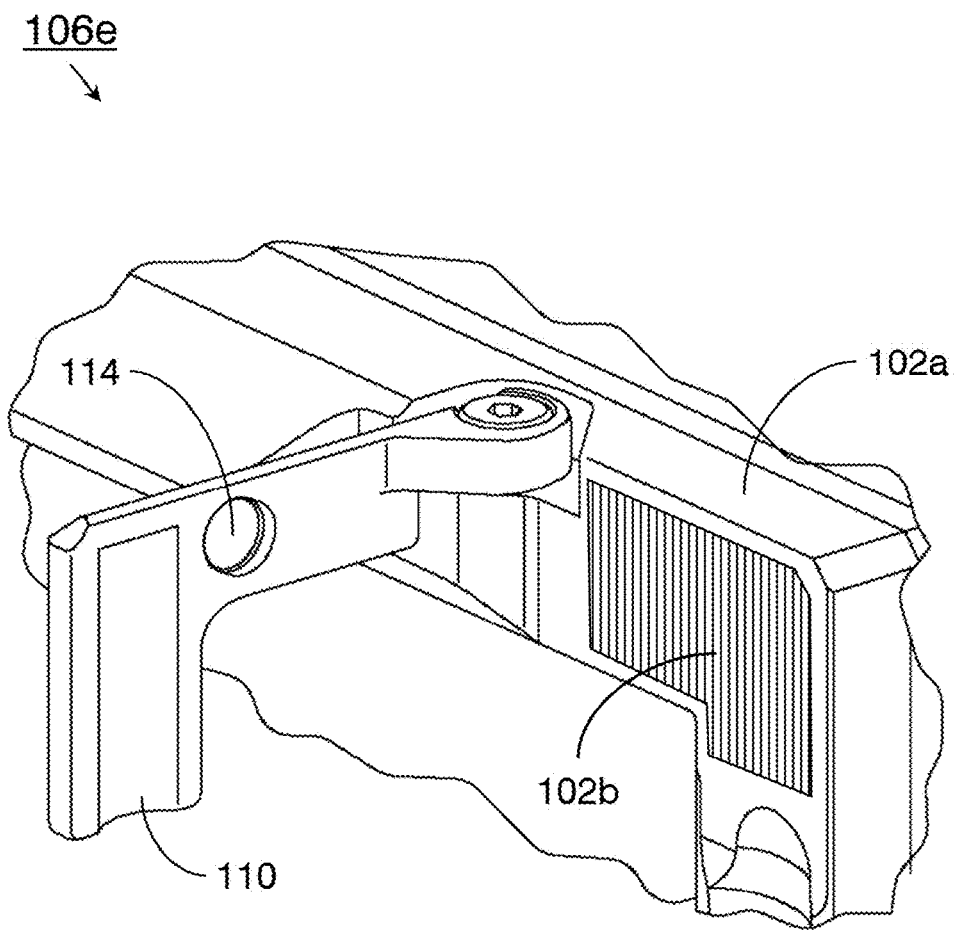

Referring to FIG. 3C, the I/E mechanism 106e may be implemented and may function similarly to the I/E mechanism 106 of FIG. 2, except that the I/E mechanism 106e may include a bezel 102a fully or partially fashioned of a simple or passive magnetic material (102b). The bezel 102a may be implemented similarly to the bezel 102 of FIG. 2, except that the bezel 102a may not include an embedded bezel magnet (116, FIG. 2). The passive magnetic material of the bezel 102a may attract the paddle magnet 114 and maintain the paddle 110 in a stowed position (see FIGS. 1/1A).

Figure 4:
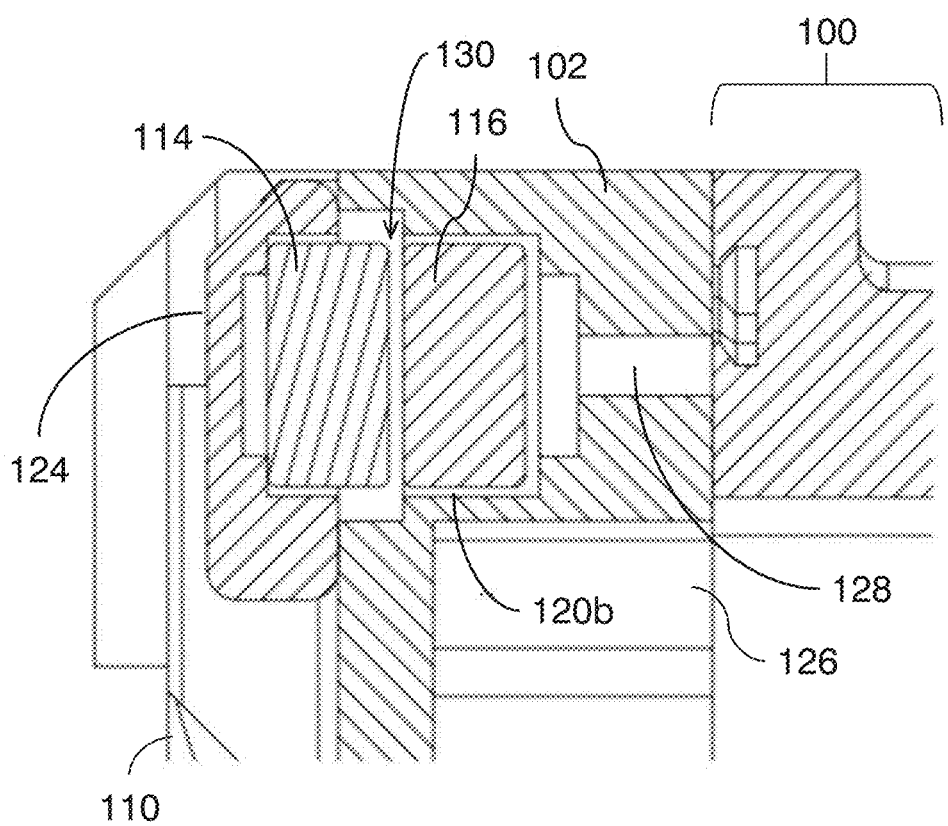
FIG. 4 is a partial cross-section of the I/E mechanism of FIG. 3 in the stowed position.

FIG. 4 (Counterbore+Adhesive Well)

Referring to FIG. 4, the I/E mechanism 106f may be implemented and may function similarly to the I/E mechanism 106b of FIG. 3, except that the paddle magnet 114 or bezel magnet 116 of the I/E mechanism 106f may be set (into the paddle 110 or bezel 102 respectively) using an adhesive (e.g., two-part epoxy resin) applicable through a reverse surface, e.g., the exterior surface 124 of the paddle 110 or the interior surface 126 of the bezel 102. For example, the bezel magnet 116 may be set into a counterbore 120b having an adhesive well 128 into which an adhesive may be introduced through the interior surface 126 of the bezel 102 (e.g., when the bezel 102 is detached from the LRU 100). In embodiments incorporating rare earth magnets or other fragile or brittle materials, the paddle magnet 114 and bezel magnet 116 may be positioned so that when the I/E mechanism 106f is in the stowed position, the paddle magnet 114 and bezel magnet 116 are separated by a small gap (130) that prevents the paddle magnet 114 and bezel magnet 116 from directly contacting or impacting each other but does not otherwise impede the attraction of the paddle magnet 114 and bezel magnet 116.

FIG. 5 (Non-Rectangular LRU)

Referring to FIG. 5, an LRU 100c may be implemented and may function similarly to the LRU 100, 100a-b of FIGS. 1/1A and 2/2A, except that the LRU 100c may be a non-rectangular LRU having a non-rectangular bezel 102c and configured to be installed into (and extracted from) a non-rectangular recess (108a, FIG. 1). For example, the LRU 100c (and the non-rectangular bezel 102c) may be: elliptical in shape; rectangular in shape, but having one or more rounded corners; or otherwise non-rectangular as design or spacing considerations warrant. I/E mechanisms 106g-h may be implemented and may function similarly to the I/E mechanisms 106b-c of FIGS. 3-3A, except that the I/E mechanisms 106g-h may be positioned at opposing ends of an axis 132 (e.g., a horizontal, vertical, or major axis) of the non-rectangular bezel 102c. The I/E mechanisms 106g-h may include paddles 110d rotatably mounted to the non-rectangular bezel 102c via hinges 112. The I/E mechanisms 106g-h may include a paddle magnet 114 embedded in the paddle 110d and configured to attract a bezel magnet 116 of opposite orientation embedded in the non-rectangular bezel 102c, thereby removably holding the paddle 110d in the stowed position (shown by I/E mechanism 106g) against the non-rectangular bezel 102c. In some embodiments, the I/E mechanisms 106g-h may include a paddle magnet 114 configured to maintain the paddle 110d in the stowed position (shown by I/E mechanism 106g) against the bezel 102c via magnetic attraction to the bezel magnet 116 (or the simple magnetic material of the bezel 102c). Depending on the precise shape of the non-rectangular bezel 102c, the I/E mechanisms 106g-h may be mounted at opposite ends of the non-rectangular bezel 102c along a diagonal major axis (132a) of the non-rectangular bezel 102c, or at any position on the bezel 102c determined to provide sufficient support that the LRU 100c may be installed in or extracted from its housing (not shown) via the two paddles 110d in the open position (shown by I/E mechanism 106h).

As will be appreciated from the above, systems and methods according to embodiments of the inventive concepts disclosed herein may simplify the installation and extraction of an avionics display unit or similar LRU while reducing its overall size, weight, and complexity. The use of reduced-size magnetically latched paddles as opposed to full-size handles allows for efficient, fastener-free and tool-free installation and extraction of the LRU while allowing for a larger, more ergonomic display surface.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

We claim:

1. A magnetically latched installation and extraction (I/E) mechanism, comprising:
    at least one bezel of a Line Replaceable Unit (LRU), the bezel configured to define at least one of a forward surface and a forward edge of the LRU, the LRU installable in and extractable from a housing mounted to an instrument panel of a vehicle;

at least one paddle hingedly coupled to the bezel, the paddle associated with an open position and a stowed position, the LRU installable in, and extractable from, the instrument panel via the at least one paddle; and at least one magnet disposed within at least one-of the paddle and the bezel, the at least one magnet configured to removably secure the paddle to the bezel in the stowed position, wherein:

the at least one paddle includes an inner surface having a first recess;

the bezel includes at least one second recess corresponding to the first recess; and the at least one paddle is configured to be deployed from the stowed position to the open position by inserting at least one of a finger and a tool between the first recess and the second recess.

2. The magnetically latched I/E mechanism of claim 1, wherein the at least one magnet is a first magnet, further comprising:

at least one second magnet disposed within at least one of the bezel and the paddle in an attractive orientation to the first magnet, the at least one second magnet configured to removably secure the paddle to the bezel in the stowed position by attracting the first magnet.

3. The magnetically latched I/E mechanism of claim 2, wherein the at least one first magnet and the at least one second magnet include one or more of a permanent magnet and a rare earth magnet.

4. The magnetically latched I/E mechanism of claim 2, wherein one or more of the at least one first magnet and the at least one second magnet is threadedly disposed in a threaded recess set into the at least one of the paddle and the bezel.

5. The magnetically latched I/E mechanism of claim 2, wherein one or more of the at least one first magnet and the at least one second magnet is adhesively secured in a counterbore set into the at least one of the paddle and the bezel, the counterbore comprising at least one well configured to receive an adhesive via at least one of an outer surface of the paddle and an inner surface of the bezel.

6. The magnetically latched I/E mechanism of claim 2, wherein the at least one first magnet and the at least one second magnet are separated by a gap when the at least one paddle is in the stowed position.

7. The magnetically latched I/E mechanism of claim 1, wherein:

the bezel is a rectangular bezel;

the at least one paddle includes a first paddle proximate to a first corner of the bezel and a second paddle proximate to a second corner of the bezel, the second corner opposite the first corner; and the at least one magnet includes at least a third magnet disposed proximate to the first corner and a fourth magnet disposed proximate to the second corner.

8. The magnetically latched I/E mechanism of claim 1, wherein at least one of the paddle and the bezel is at least partially fashioned of a passive magnetic material, the at least one magnet configured to removably secure the paddle to the bezel in the stowed position by attracting the passive magnetic material.

9. The magnetically latched I/E mechanism of claim 1, wherein the at least one magnet is at least partially surrounded by a protective jacket.

10. The magnetically latched I/E mechanism of claim 1, wherein:

the LRU includes at least one of a display unit, a communications component and a composite bank of primary flight instruments; and the vehicle includes at least one of an aircraft, a ground-based vehicle, and a water-based vehicle.

11. The magnetically latched I/E mechanism of claim 1, wherein:

the bezel is a non-rectangular bezel having at least one major axis; and the at least one paddle is disposed proximate to the major axis.

12. A line replaceable unit (LRU), comprising:

at least one housing of a line replaceable unit (LRU) installable in, and extractable from, an instrument panel of a vehicle;

at least one bezel attached to the housing and configured to define at least one of a forward surface and a forward edge of the LRU;

at least one paddle hingedly coupled to the bezel, the paddle associated with an open position and a stowed position, the housing installable in and extractable from the instrument panel via the at least one paddle; and at least one magnet disposed within at least one of the paddle and the bezel, the at least one magnet configured to removably secure the paddle to the bezel in the stowed position, wherein:

the at least one paddle includes an inner surface having a first recess;

the bezel includes at least one second recess corresponding to the first recess; and the at least one paddle is configured to be deployed from the stowed position to the open position by inserting at least one of a finger and a tool between the first recess and the second recess.

13. The LRU of claim 12, wherein the at least one magnet is a first magnet, further comprising:

at least one second magnet disposed within at least one of the bezel and the paddle in an attractive orientation to the first magnet, the at least one second magnet configured to removably secure the paddle to the bezel in the stowed position by attracting the first magnet.

14. The LRU of claim 13, wherein at least one of the first magnet and the second magnet includes at least one of a rare earth magnet and a permanent magnet.

15. The LRU of claim 12, wherein:

the bezel is a rectangular bezel;

the at least one paddle includes a first paddle proximate to a first corner of the bezel and a second paddle proximate to a second corner of the bezel, the second corner opposite the first corner; and the at least one magnet includes at least a third magnet disposed proximate to the first corner and a fourth magnet disposed proximate to the second corner.

16. The LRU of claim 12, wherein at least one of the paddle and the bezel is at least partially fashioned of a passive magnetic material, and the at least one magnet is configured to removably secure the paddle to the bezel in the stowed position by attracting the passive magnetic material.

17. The LRU of claim 12, wherein:

the LRU includes at least one of a display unit, a communications component, and a composite bank of primary flight instruments; and the vehicle includes at least one of an aircraft, a ground-based vehicle, and a water-based vehicle.

18. The LRU of claim 12, wherein the bezel is a non-rectangular bezel having at least one major axis, and the at least one paddle is disposed proximate to the major axis.

\* \* \* \* \*